United States Patent
Hasegawa

(12) 
(10) Patent No.: US 6,653,836 B2
(45) Date of Patent: Nov. 25, 2003

(54) RESONANCE SIGNAL DETECTOR

(75) Inventor: Kenichi Hasegawa, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 10/103,152

(22) Filed: Mar. 21, 2002

(65) Prior Publication Data

US 2002/0153895 A1 Oct. 24, 2002

(30) Foreign Application Priority Data

Mar. 26, 2001 (JP) ........................................ 2001-087706

(51) Int. Cl.[7] .................................................. G01V 3/00
(52) U.S. Cl. ........................ 324/322; 324/318; 324/309
(58) Field of Search ................................. 324/318, 322, 324/319, 320, 313, 314, 309; 343/770; 128/653.2

(56) References Cited

U.S. PATENT DOCUMENTS

| | | | | |
|---|---|---|---|---|
| 4,742,304 A | * | 5/1988 | Schnall et al. | 324/318 |
| 5,017,872 A | * | 5/1991 | Foo et al. | 324/322 |
| 5,476,095 A | * | 12/1995 | Schnall et al. | 128/653.2 |
| 5,977,924 A | * | 11/1999 | Takei et al. | 343/77 |
| 6,242,919 B1 | * | 6/2001 | Zuk et al. | 324/322 |

FOREIGN PATENT DOCUMENTS

EP 0498571 1/1992

* cited by examiner

Primary Examiner—Diego Gutierrez
Assistant Examiner—Brij B. Shrivastav
(74) Attorney, Agent, or Firm—Webb Ziesenheim Logsdon Orkin & Hanson, P.C.

(57) ABSTRACT

A resonance signal transmitter detector for irradiating a sample with an RF magnetic field and detecting the resulting resonance signal, such as an NMR signal having conductors used for detection of the resonance signal. The conductors are covered with a dielectric material. An external electric circuit is added between the conductors to avoid degeneracy of resonance modes.

9 Claims, 15 Drawing Sheets

--- MAGNETIC LINE OF FORCE
— ELECTRIC LINE OF FORCE

--- MAGNETIC LINE OF FORCE
— ELECTRIC LINE OF FORCE

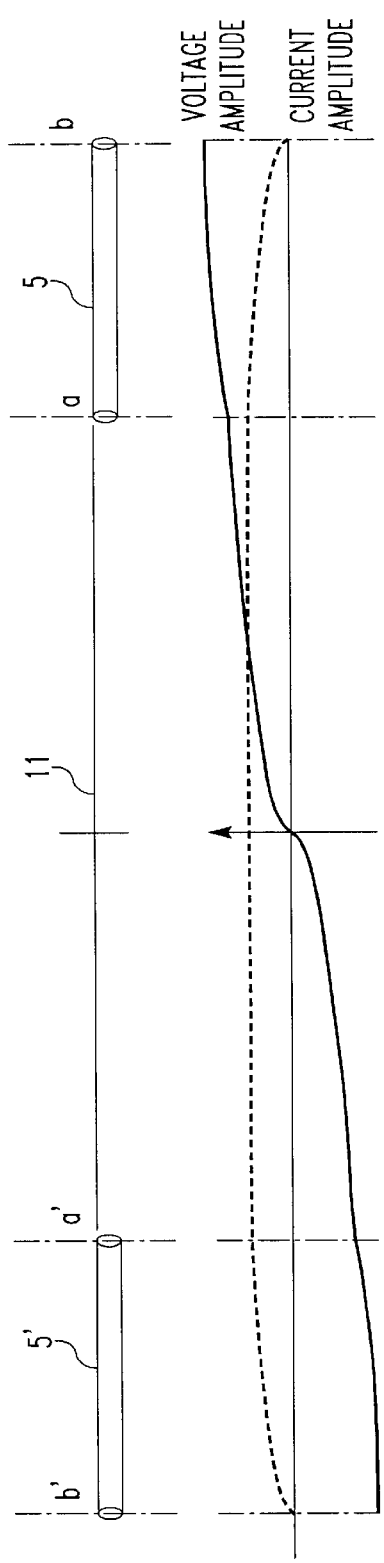
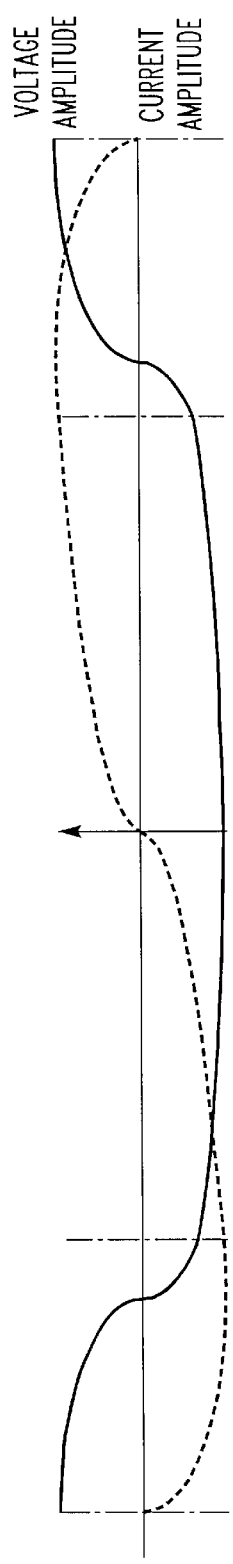
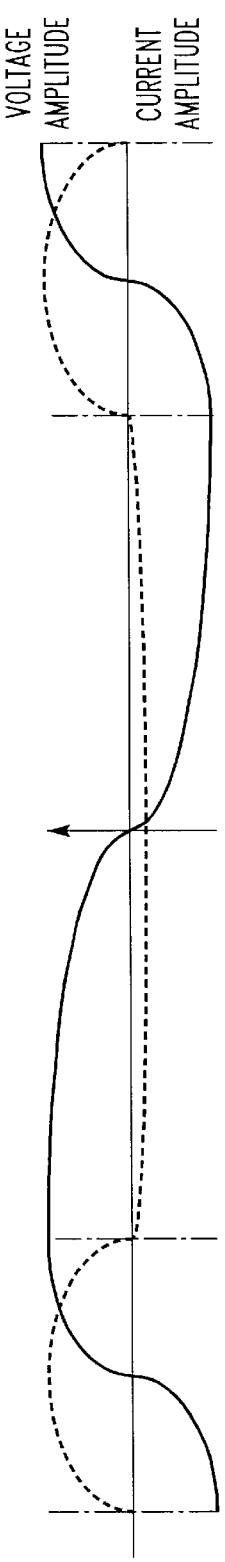
FIG.4(a)
FIG.4(b)
FIG.4(c)

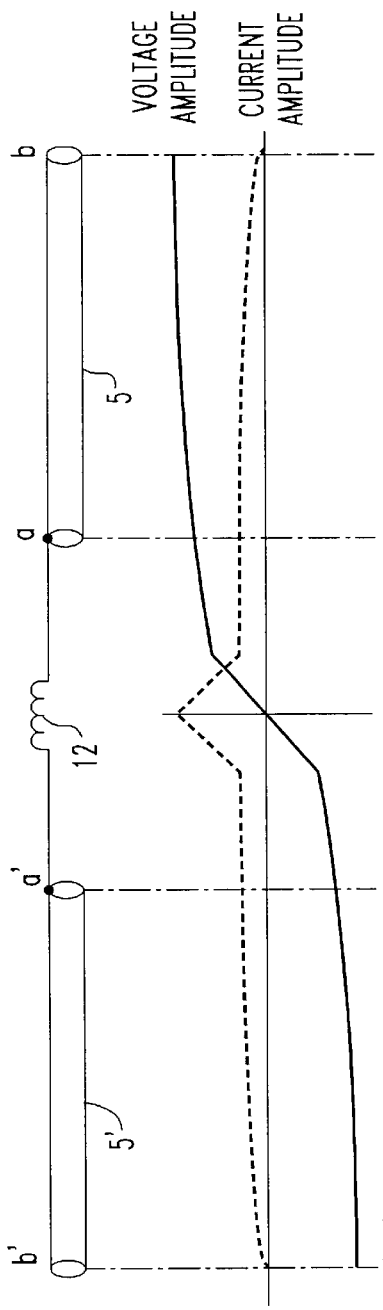
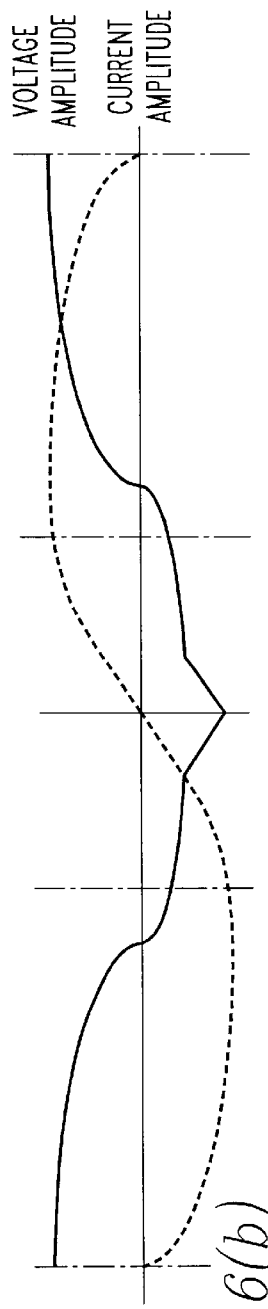
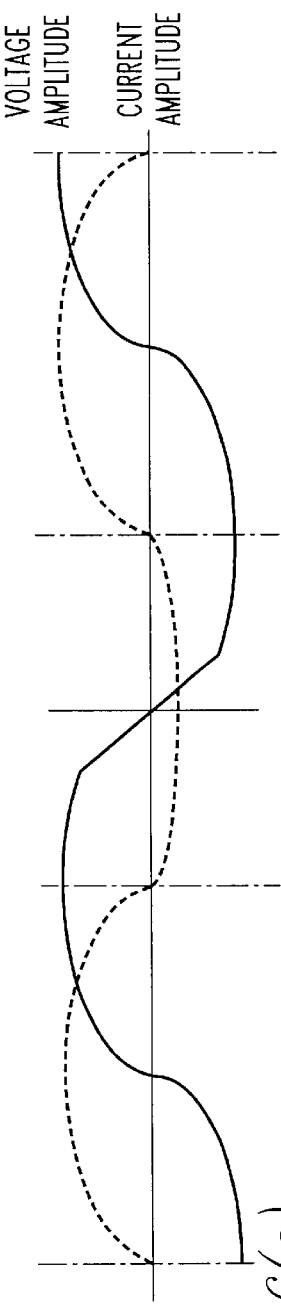
FIG.6(a)
FIG.6(b)
FIG.6(c)

RESONANCE SIGNAL DETECTOR

BACKGROUND OF THE INVENTION

1. Field of the Invention

The present invention relates to a resonator used for NMR detection and, more particularly, to a resonance signal detector with enhanced sensitivity.

2. Description of Related Art

A conventional NMR detector is illustrated in FIG. 15. This detector has a bobbin 2 accommodating a sample tube 1. A saddle coil 3 is formed from wire around the bobbin 2. The ends of two extraction lines from the saddle coil 3 are connected together via a capacitor 4. In this way, an LC resonance circuit is formed by the saddle coil 3 and capacitor 4. This resonance circuit is connected with an external tuning and matching circuit (not shown). This resonance circuit produces an RF magnetic field that is directed at a sample within the sample tube 1. The resulting resonance signal is detected by the saddle coil 3.

In this conventional detector coil, an electrical current flows through the wound lead wire. Therefore, electrical resistance results in energy loss. At room temperature, the Q factor is as low as around 200. Furthermore, the detector coil produces a strong RF electric field within the sample space. Therefore, the dielectric loss due to the sample is large. This further deteriorates the Q factor. In addition, the RF electric field produced in the sample space dielectrically heats the sample.

SUMMARY OF THE INVENTION

The present invention is intended to provide a technique for producing a high Q factor even at room temperature, producing enhanced sensitivity by weakening the intensity of the RF electric field leaking into the sample space, and reducing heating of the sample by decreasing dielectric heating due to the RF electric field. For this purpose, a detector coil, in accordance with the present invention, is covered with a dielectric material, especially a ferroelectric material, or buried in a ferroelectric material. An electric circuit is attached to the outside. In this way, a high-sensitivity detector coil is obtained. A distributed constant coil that is brought into resonance by standing electromagnetic waves can have a high Q factor but the resonance frequency is too high to be used in NMR. Accordingly, the coil is covered with a ferroelectric material. This increases the dielectric constant of the surroundings of the coil, which in turn decreases the propagation speed of electromagnetic waves. In consequence, the wavelength of electromagnetic waves shortens. As a result, a resonance frequency that can be used in NMR and derived from a distributed constant coil is obtained, the coil being brought into resonance by standing waves.

In the coil of this structure, resonance modes are degenerate and so it is difficult in practice to produce RF magnetic field distribution necessary for measurement. However, the necessary RF magnetic field distribution can be generated by attaching an electric circuit to the coil so as to circumvent degeneracy. Shortening the wavelength of an electromagnetic field is equivalent to reducing the length while the width of the conductors passing electric current remains the same. Therefore, the electrical resistive component decreases, increasing the Q factor. This enhances the sensitivity. Furthermore, the ferroelectric material reduces the impedance of the coil. Where the same intensity of RF magnetic field is produced, the RF voltage generated by the current necessary to produce it decreases. Consequently, the intensity of the RF electric field produced in the sample space and applied to the sample decreases. This alleviates the dielectric loss due to the sample. Hence, heating of the sample and decrease of the Q factor can be prevented. A high sensitivity not dependent on the dielectric loss factor of the sample is obtained.

BRIEF DESCRIPTION OF THE DRAWINGS

FIGS. 4(a), 4(b), and 4(c) are diagrams illustrating the manner in which degeneracy is avoided by a conducting line 11 of the first embodiment;

FIGS. 6(a), 6(b), and 6(c) are diagrams illustrating the manner in which degeneracy is avoided by a coil 12 of the second embodiment;

DESCRIPTION OF THE PREFERRED EMBODIMENTS

Figure 1B:
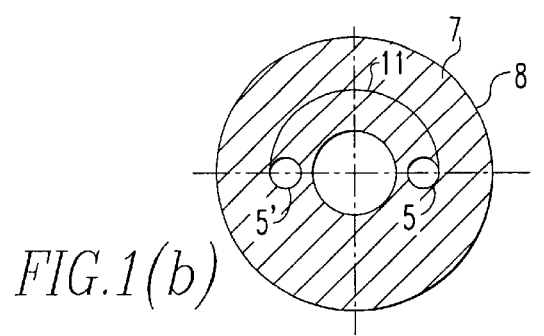
FIGS. 1(a)–1(d) are views illustrating a first embodiment of the present invention.
Figure 1A:
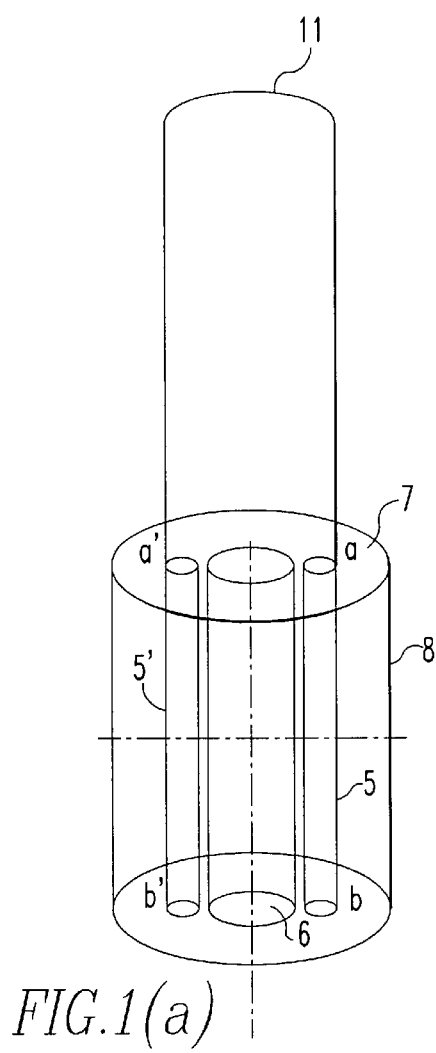
Figure 1C:
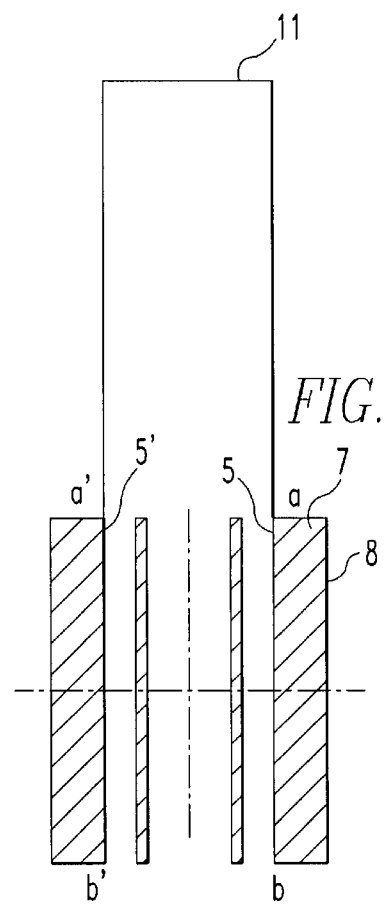
Figure 1D:
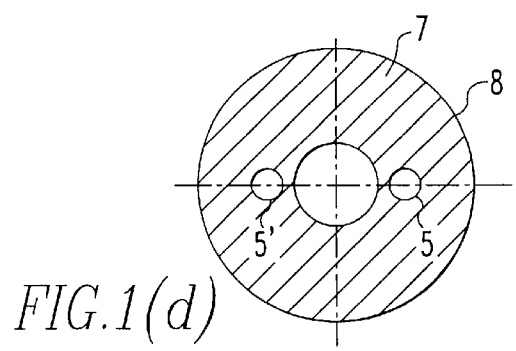

Preferred embodiments of the present invention are hereinafter described with reference to the accompanying drawings. FIGS. 1(a)–1(d) illustrate a first embodiment of the present invention. FIG. 1(a) is a perspective view. FIG. 1(b) is a top view. FIG. 1(c) is a cross-sectional view taken along the center axis. FIG. 1(d) is a bottom view. A coil assembly comprises a pair of conductors 5, 5' and a cavity body 7 positioned in an annular space formed between a cylindrical shield 8 and a cylindrical cavity 6. Each of the conductors 5 and 5' is made of a metal rod, metal pipe, or metallization layer sintered onto the inner wall of a hole formed in the cavity body 7. The conductors 5 and 5' form paths of RF current. In the case of FIG. 1, the inner wall of the hole formed in the cavity body 7 is metallized. The cavity body 7 is made of a dielectric material having a dielectric constant larger than that of air (e.g., sapphire and titanium oxide-based ceramics). A sample (not shown) and a sample tube (not shown) are placed in the cylindrical cavity 6. The upper ends of the conductors 5 and 5' are indicated by a and a', respectively, while their lower ends are indicated by b and b', respectively. The conductors 5 and 5' are shorted together at their respective one side by a conducting line 11. In the illustrated example, the upper ends a and a' are shorted together. The conducting line 11 is exposed, that is, not covered with the cavity body 7. The length of the conducting line 11 is so set that where its both ends are opened, the self-resonance frequency is coincident with the desired self-resonance frequency of the coil assembly. Since tuning and matching circuits are well-known techniques, the circuits are not shown.

Where the coil assembly consists only of the pair of conductors 5, 5', cylindrical shield 8, and cavity body 7, there exist two kinds of resonance modes that are degenerate at the self-resonance frequency or two resonance modes of close frequencies. These are described by referring to FIGS. 2(a)–2(c) and 3(a)–3(c), respectively.

Figure 2C:
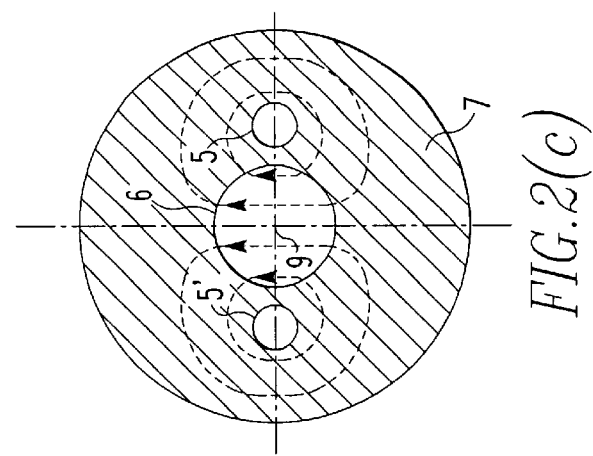
FIGS. 2(a)–2(c) are views illustrating a resonance mode that can be used for a detector coil.
Figure 2B:
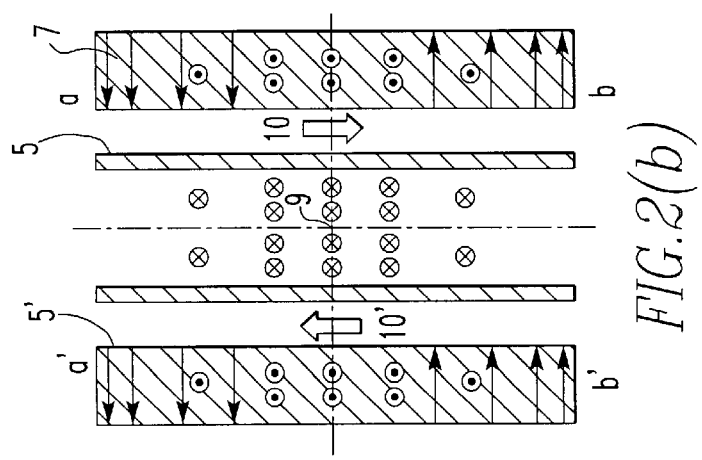
Figure 2A:
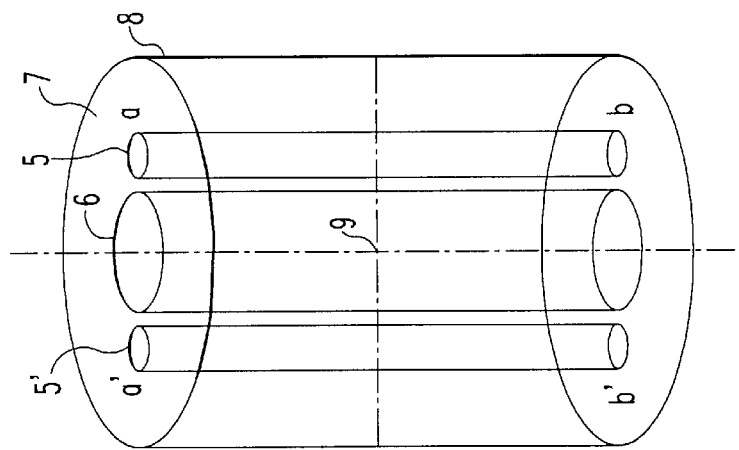

FIGS. 2(a)–2(c) illustrate a resonance mode that can be used by a detector coil by producing an RF magnetic field in the center of the coil. FIG. 2(a) shows the coil assembly. FIG. 2(b) is a cross-sectional view taken along the axis of the cylinder. FIG. 2(c) is a cross-sectional view taken perpendicularly to the axis of the cylinder. The directions and distributions of a magnetic field and an electric field at the moment when their intensities are maximized are indicated by broken lines and solid lines, respectively. The directions of electric currents flowing through the conductors 5 and 5' are indicated by arrows 10 and 10', respectively. Voltages (indicated by horizontal arrows) produced at the ends a and a' of the conductor 5 and at the ends b and b' are opposite in sign. Standing waves of a half wavelength sit on the conductors 5 and 5'. RF currents flowing through the conductors 5 and 5' at resonance are opposite to each other in direction as indicated by the arrows 10 and 10'. Therefore, an RF magnetic field of maximum strength is produced in the position of the center 9 of the coil and is directed at the sample. Therefore, this coil assembly can be used as a detector coil.

Figure 3C:
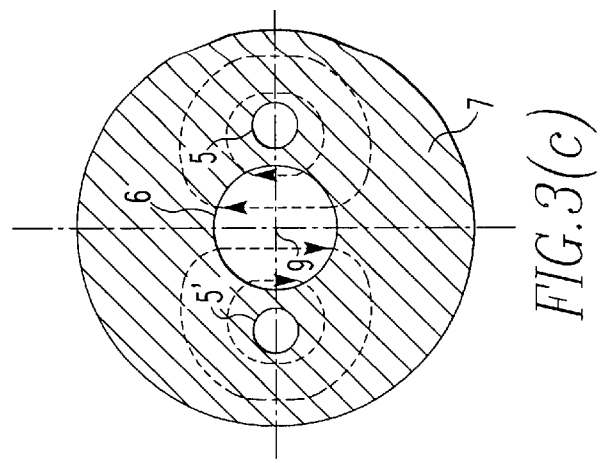
FIGS. 3(a)–3(c) are views illustrating a resonance mode that cannot be used for a detector coil.
Figure 3B:
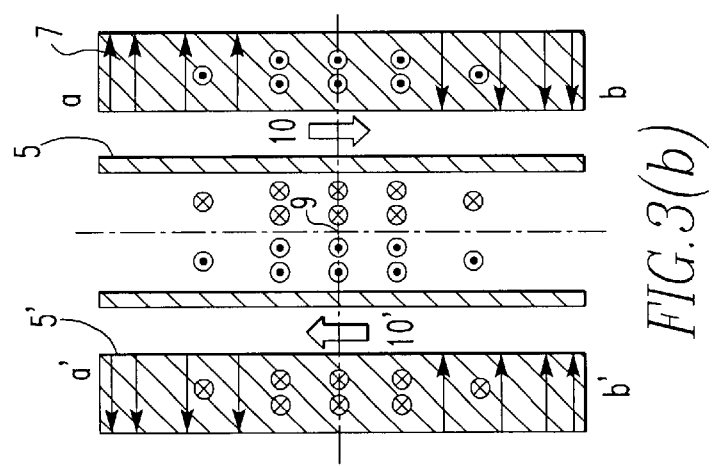
Figure 3A:
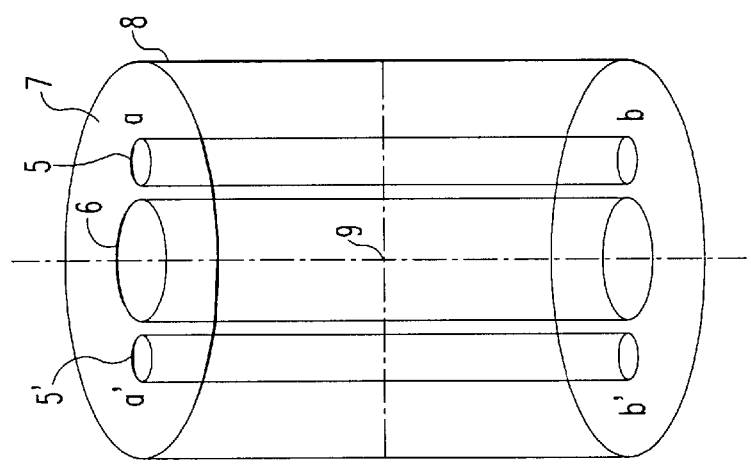

FIGS. 3(a)–3(c) illustrate a resonance mode in which RF magnetic fields on opposite sides of the center of a coil cancel out. Thus, this coil assembly cannot be used as a detector coil. FIG. 3(a) shows the coil assembly. FIG. 3(b) is a cross-sectional view taken along the axis of the cylinder. FIG. 3(c) is a cross-sectional view taken perpendicularly to the axis of the cylinder. The directions and distributions of a magnetic field and an electric field at the moment when their intensities are maximized are indicated by broken lines and solid lines, respectively. As shown, there exists a mode in which RF currents flow through the conductors 5 and 5' in the same direction at frequencies close to the resonance frequency of the resonance mode (that can be used by a detector coil) shown in FIGS. 2(a)–2(c) as indicated by the arrows 10 and 10'. Voltages (indicated by horizontal arrows) produced at the ends a and a' of the conductor 5 and at the ends b and b' are identical in sign. If the side of the ends a and a' is taken as positive, the side of the ends b and b' is negative. As a cavity body having a greater dielectric constant is used, the frequencies of the modes of FIGS. 2(a)–2(c) and 3(a)–3(c), respectively, come closer. In the resonance mode of FIGS. 3(a)–3(c), RF currents flowing through the conductors 5 and 5' are in the same direction and so the RF magnetic fields cancel out in the center 9 of the coil. Under this condition, if electric power is supplied into the coil, no RF magnetic field is produced and, therefore, the coil does not operate as a detector coil.

In the first embodiment shown in FIGS. 1(a)–1(d), the conductors 5 and 5' are connected together by the conducting line 11. Consequently, the resonance mode of FIGS. 3(a)–3(c) does not exist. This is described in further detail by referring to FIGS. 4(a)–4(c), which is an expanded view of conductor 5', conducting line 11, and conductor 5 (FIGS. 1(a)–1(d)) that together form a coil assembly. The directions of the conductors 5 and 5' correspond to the directions at the edges a, b, and a', b', respectively, of FIGS. 1(a)–1(d). The directions of voltage and current as the instant when they assume their maximum values are shown at successively higher frequencies. The horizontal axis indicates the position. The vertical axis indicates the voltage and current amplitude. In the expanded view, the upward direction is a rightward flow. FIGS. 4(a), 4(b), and 4(c) show resonance modes at successively higher frequencies. Voltages are indicated by solid lines, while currents are indicated by broken lines.

This coil assembly acts as a transmission line which is made up of conductor 5', conducting line 11, and conductor 5, and whose both ends are open. Since a standing wave is produced on this transmission line, a resonant state occurs. Where the characteristic impedance of this line is considered, the conductors 5 and 5', which are surrounded by the cavity body 7 having a large dielectric constant, are much smaller in characteristic impedance than the conducting line 11. The characteristic impedance decreases with increasing the dielectric constant of the cavity body 7. The characteristic impedance decreases with increasing the volume filling factor of the cavity body within the coil assembly. Because the conductors 5 and 5' are lower in characteristic impedance than the conducting line 11, the conductors 5 and 5' generate lower RF voltage if the same RF current flows.

The third resonance mode of FIG. 4(c) is substantially coincident with the self-resonance of the coil assembly. Since the conducting line 11 becomes a half-wavelength resonant line, the voltage amplitude is almost null and the current amplitude is maximal near the middle point of the conducting line 11. At both ends of the conducting line 11, the voltage amplitudes are maximal and opposite in sign. The current amplitude is almost zero. At this time, voltages of opposite signs are applied to the ends a and a' of the conductors 5 and 5' and so an electric current flows in direction a→b and direction b'→a', respectively. As a result, the resonance mode shown in FIGS. 3(a)–3(c) disappears. Only the resonance mode shown in FIGS. 2(a)–2(c) is left. Hence, generation and detection of an RF magnetic field can be performed in the center of the coil.

If RF electric power is supplied into a detector made up of the coil assembly and conducting line 11, the supplied electric power mostly concentrates in the coil assembly. Therefore, where the conducting line 11 is connected, the decrease in the RF magnetic field strength is negligibly small compared with the supplied RF electric power, for the following reason. The conducting line 11 is higher in characteristic impedance than the conductors 5 and 5'. As shown in FIG. 4(c), if the same voltage is generated at the end a or a', less current flows through the conducting line 11. Therefore, most of the electric power is distributed on the sides of the conductors 5, 5' of the coil assembly. As a result, the third resonance mode of FIG. 4(c) can be utilized for a high-sensitivity detector coil. In the first resonance mode of FIG. 4(a), the electric power in the portion of the conducting line 11 is large and thus the sensitivity is low. Since voltages of opposite signs are applied to the ends a and a' of the conductors 5 and 5', electric current flows in direction a→b and direction b'→a', respectively. Because the coil assembly operates as a detector coil in the same way as in the third resonance mode, the coil can be employed for deuterium lock. In the second resonance mode of FIG. 4(b), voltages of the same sign are applied to the ends a and a' of the conductors 5 and 5' and, therefore, electric current flows in direction a→b and direction a'→b', respectively. Since the RF magnetic fields cancel out at the center 9 of the coil, the assembly does not operate as a detector coil. However, no problems occur, because the frequency differs widely from the frequencies of FIGS. 4(a) and 4(c).

Because the coil assembly of the present embodiment is filled with the cavity body 7, the wavelength of electromagnetic waves is shortened by the dielectric constant of the cavity body. For this reason, the conductors 5 and 5' are identical in width to the case where the cavity body 7 is not present, but are shorter than in this case. This reduces the electric resistance loss, increasing the Q factor. In consequence, the sensitivity is improved. Furthermore, the ferroelectric material reduces the impedance of the coil. Therefore, the RF voltage generated by the electric current necessary to produce an RF magnetic field of the same strength is reduced. In addition, the RF electric field concentrates in the ferroelectric material, reducing the strength of the RF electric field leaking into the sample space. Since the strength of the RF electric field applied to the sample decreases, the dielectric loss decreases and thus the dielectric heating of the sample decreases. Consequently, decrease of the Q factor can be prevented. A high sensitivity not dependent on the dielectric loss factor of the sample is obtained.

Figure 5B:
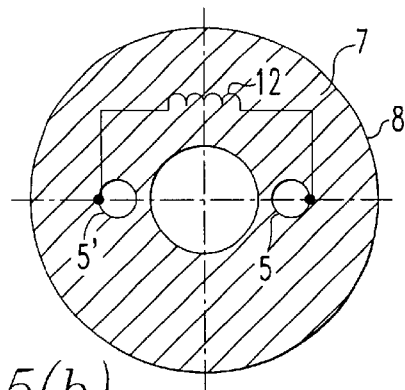
FIGS. 5(a)–5(d) are views illustrating a second embodiment of the present invention.
Figure 5A:
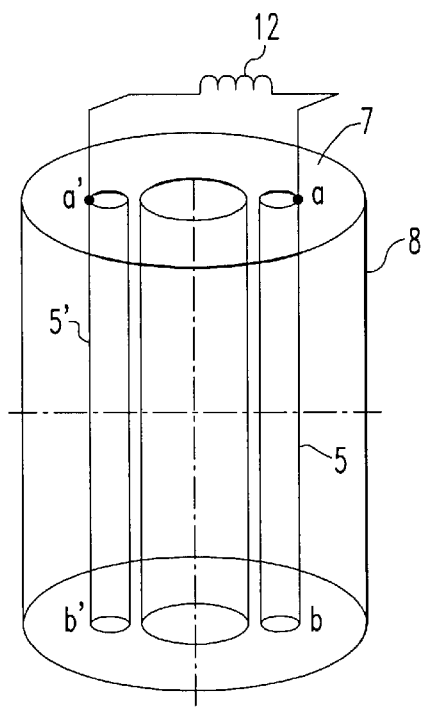
Figure 5C:
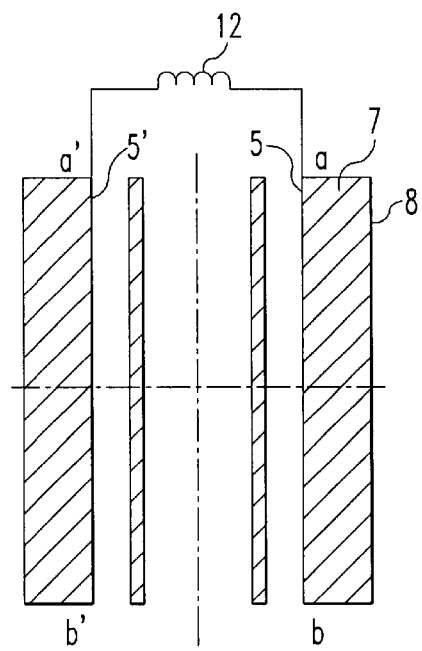
Figure 5D:
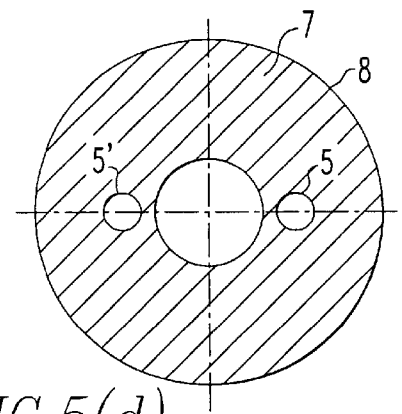

FIGS. 5(a)–5(d) show a second embodiment of the present invention. FIG. 5(a) is a perspective view. FIG. 5(b) is a top view. FIG. 5(c) is a cross-sectional view taken along the center axis. FIG. 5(d) is a bottom view. Those components of FIGS. 5(a)–5(d) which are the same as their respective counterparts of FIGS. 1(a)–1(d) are indicated by the same reference numerals as in FIG. 1, and their description is omitted. The geometry of FIGS. 5(a)–5(d) is similar to the geometry of FIGS. 1(a)–1(d) except that the conducting line 11 acting as distributed inductance in FIGS. 1(a)–1(d) is replaced by a coil 12 acting as lumped inductance. The inductance value of the coil 12 connecting the conductors 5 and 5' is so set that when both ends are opened, self-resonance is produced at a frequency close to the self-resonance frequency of the coil assembly.

This embodiment operates similarly to the first embodiment as illustrated in FIGS. 6(a), 6(b), and 6(c). The resonance mode of FIG. 6(c) agrees with the self-resonance frequency of the coil assembly. Since voltages of opposite signs are produced at the opposite ends of the coil 12, the operation is similar to the operation in the case of FIG. 4(c). The resonance modes of FIGS. 6(a) and 6(b) are similar in operation to the modes of FIGS. 4(a) and 4(b). If the coil is stretched into a straight line, the waveforms of the voltage and current are exactly the same as those of FIGS. 4(a)–4(c).

Figure 7B:
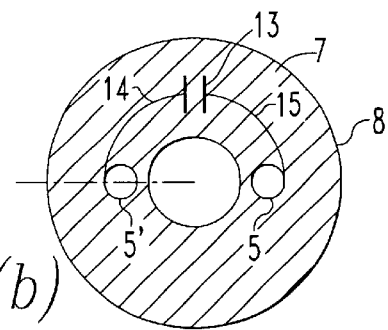
FIGS. 7(a)–7(d) are views illustrating a third embodiment of the present invention.
Figure 7A:
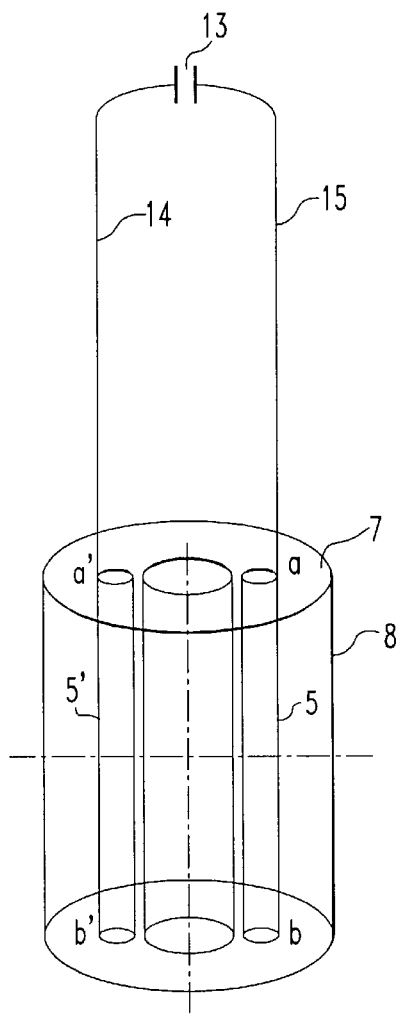
Figure 7C:
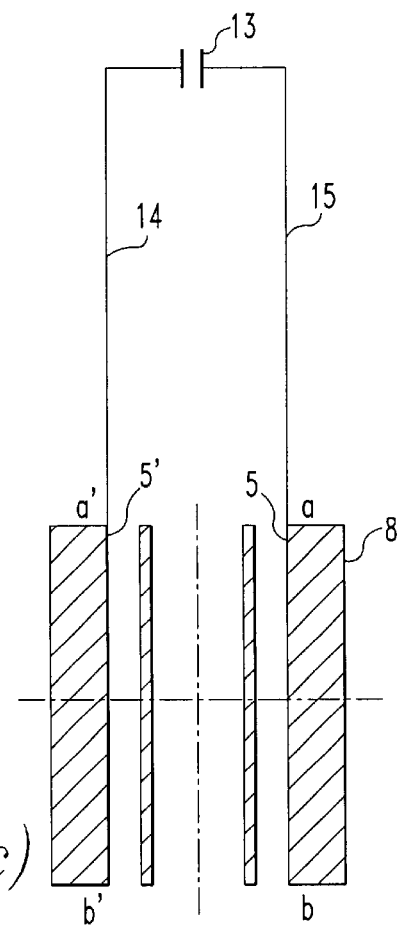
Figure 7D:
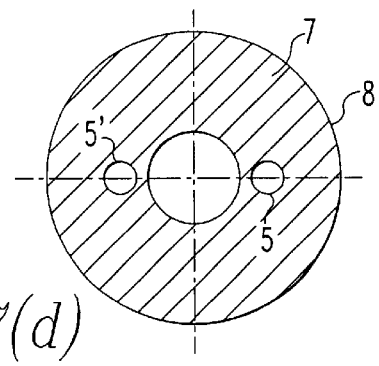

FIGS. 7(a)–7(d) illustrate a third embodiment of the invention. FIG. 7(a) is a perspective view. FIG. 7(b) is a top view. FIG. 7(c) is a cross-sectional view taken along the center axis. FIG. 7(d) is a bottom view. Those components of FIGS. 7(a)–7(d) which are the same as their respective counterparts of FIGS. 1(a)–1(d) are indicated by the same reference numerals as in FIGS. 1(a)–1(d), and their description is omitted. In the present embodiment, a conducting line 14, a capacitor 13, and another conducting line 15 are inserted between the conductors 5 and 5' to connect these conductors. An LC resonance circuit is formed. The resonance frequency of the resonance mode corresponding to FIG. 4(a) is elevated. This embodiment is identical in operation with the first embodiment.

Figure 8:
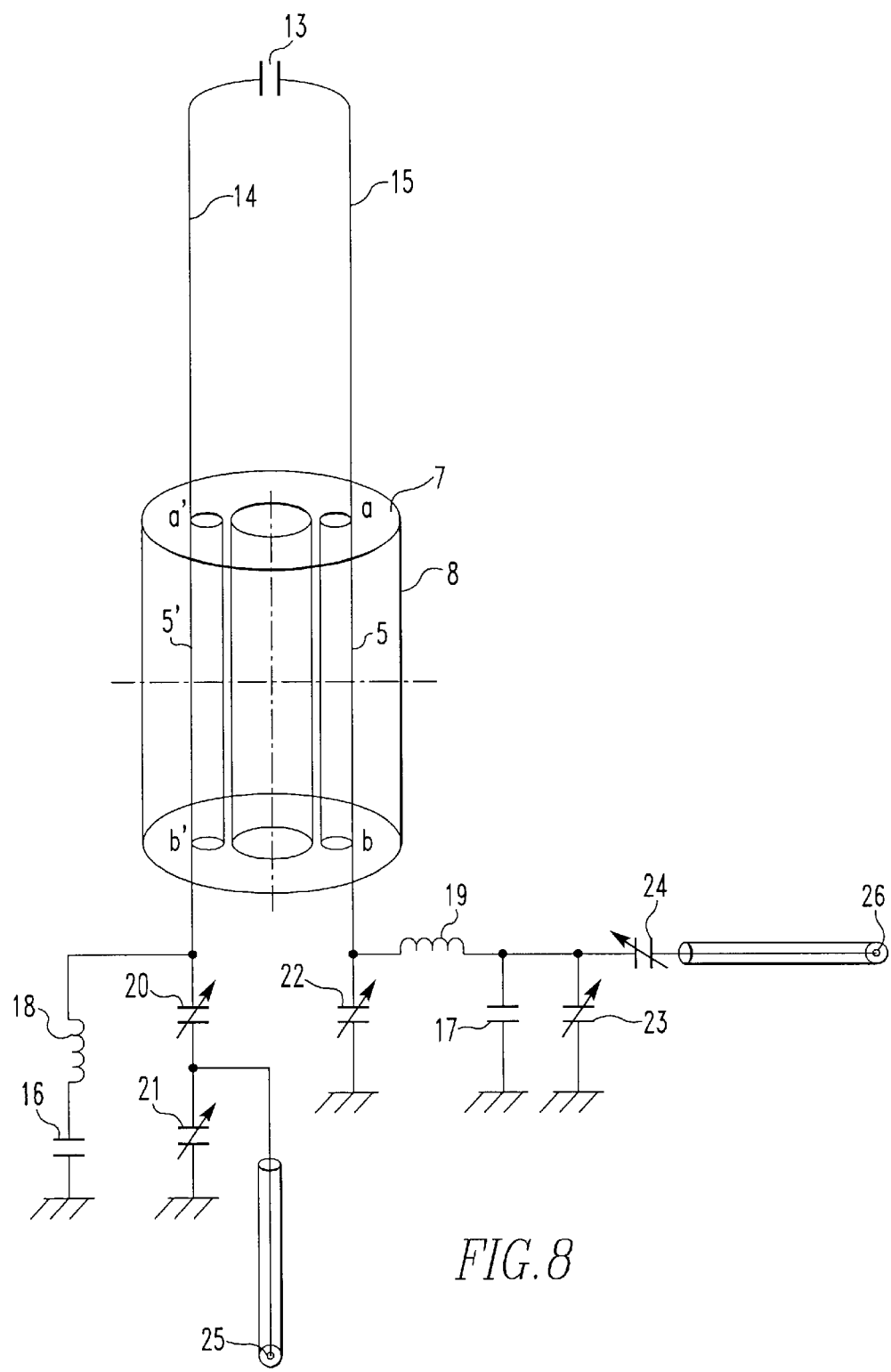
FIG. 8 is a diagram illustrating a fourth embodiment of the present invention.

FIG. 8 illustrates a fourth embodiment of the invention. This embodiment is obtained by adding a double tuning circuit having two ports to the third embodiment. A capacitor 16 having a large capacitance and a coil 18 having a large inductance together form an LC circuit. Variable capacitors 20 and 21 are connected in series. These LC circuit and series combination of the variable capacitors 20 and 21 are connected in parallel to ground on the underside of the conductor 5'. An HF (high-frequency) port 25 is connected between the variable capacitors 20 and 21. An LC circuit consisting of a coil 19 having a large inductance and a capacitor 17 having a large capacitance and a variable capacitor 22 are connected in parallel to ground on the underside of the conductor 5. A variable capacitor 23 is connected in parallel with the capacitor 17. An LF (low-frequency) port 26 is connected to the junction of the capacitor 17 and coil 19 via a variable capacitor 24.

Where the resonance frequency is high, high frequencies are cut off by the coils 18 and 19 having high inductances. Therefore, the variable capacitors 21, 20, conductor 5', conducting line 14, capacitor 13, conducting line 15, conductor 5, and variable capacitor 22 together form a resonance circuit, which is connected with a spectrometer at the HF port 25.

Where the resonance frequency is low, the variable capacitors 20, 21, and 22 are cut off. Therefore, the capacitor 16, coil 18, conductor 5', conducting line 14, capacitor 13, conducting line 15, conductor 5, coil 19, capacitor 17, and variable capacitors 23, 24 together form a resonance circuit, which is connected with the spectrometer at the LF port 26.

It is to be noted that the present invention is not limited to the embodiments described above and that various changes and modifications are possible. For example, the cylindrical shield of the coil assembly may be omitted or deformed. Furthermore, the shape of the coil assembly is not limited to a cylindrical form. The coil assembly may be deformed into a parallelepiped or multi-sided prism.

Figure 9A:
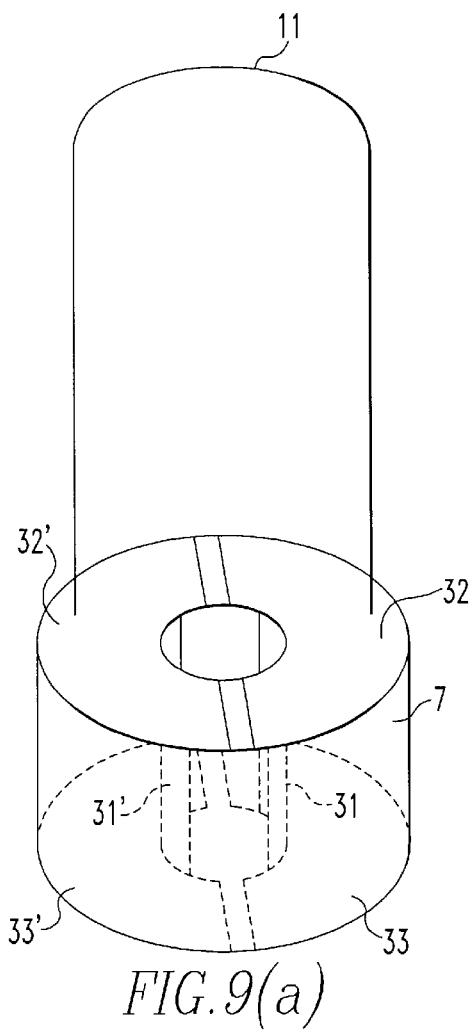
FIGS. 9(a)–9(e) are views illustrating an example in which the conducting line of a coil assembly is made up of coil bands and electrodes.
Figure 9B:
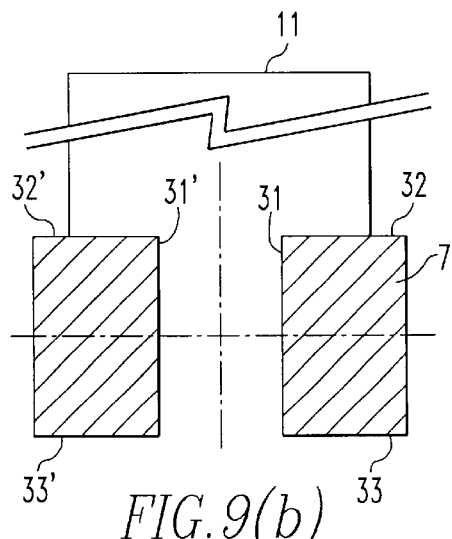
Figure 9C:
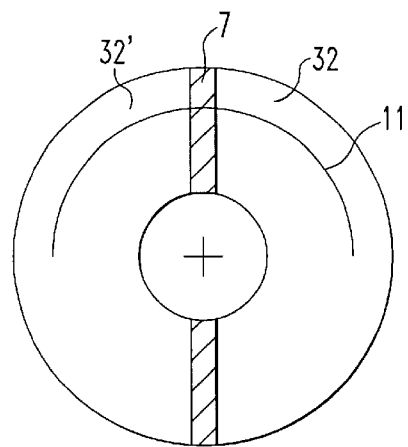
Figure 9D:
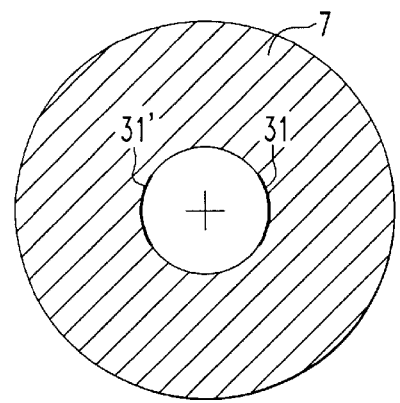
Figure 9E:
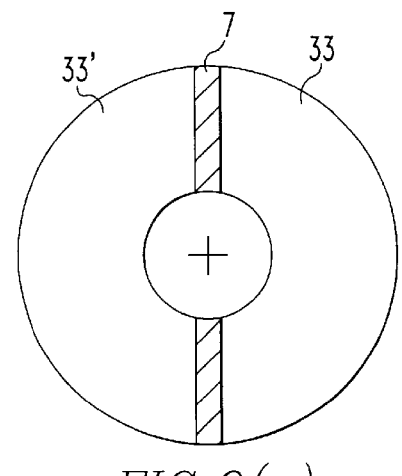

FIGS. 9(a)–9(e) show an example in which conductors of a coil assembly are made up of coil bands and electrodes. FIG. 9(a) is a perspective view. FIG. 9(b) is a vertical cross section. FIG. 9(c) is a top view. FIG. 9(d) is a horizontal cross section. FIG. 9(e) is a bottom view. In FIGS. 9(a)–9(d), a coil assembly is made up of a cavity body 7, conductive coil bands 31, 31', and sectorial electrodes 32, 32', 33, 33'. As shown, the cavity body 7 is cylindrical and provided with a hole extending axially therethrough. The cavity body 7 is annular in cross section. The coil bands 31 and 31' are stuck on the inner surface of the axial hole. The sectorial electrodes 32 and 32' stuck on the cavity body are connected with the upper ends of the coil bands 31 and 31', respectively. The sectorial electrodes 33 and 33' are similarly connected with the lower ends of the coil bands 31 and 31', respectively. The electrodes 32 and 32' are interconnected by a conducting line 11. When voltages of a half wavelength and successively opposite directions sit as standing waves on the electrode 32, coil band 31, electrode 33, electrode 32', coil band 31', and electrode 33', a maximum current flows through the centers of the coil bands 31 and 31'. As a result, a maximum strength of RF magnetic field can be produced in the central hole on the axis of the cavity body 7. The sensitivity of the NMR detector coil can be enhanced.

Figure 10A:
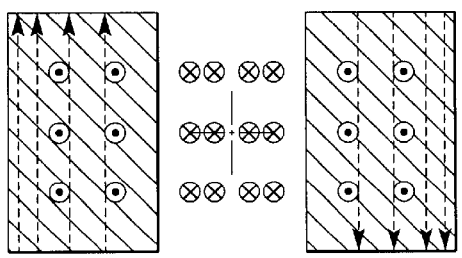
FIGS. 10(a)–10(b) are cross sections illustrating the directions of magnetic and electric fields and their distributions when the field strengths are maximized at resonance in the structure of FIGS. 9(a)–9(e)
Figure 10B:
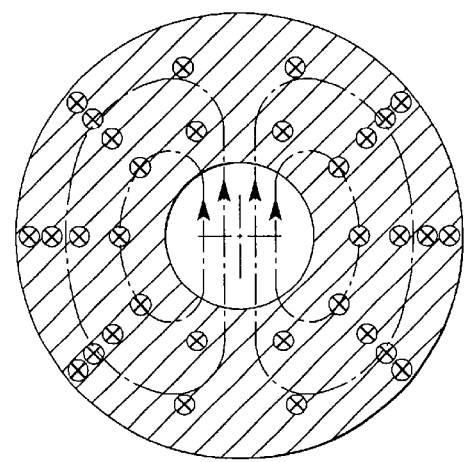

In FIGS. 10(a) and 10(b), the directions and distributions of magnetic and electric fields are indicated by solid lines and broken lines, respectively, at the moment when their intensities are maximized at resonance regarding the coil assembly shown in FIGS. 9(a)–9(d). FIG. 10(a) is a cross-sectional view taken along the axis of the cylinder. FIG. 10(b) is a cross-sectional view taken perpendicularly to the axis of the cylinder. As shown, the voltage applied between the electrodes 32 and 33 and the voltage applied between the electrodes 32' and 33' are opposite in sense. As a result, a strong RF magnetic field is produced in the central hole on the axis of the cavity body. Consequently, the coil assembly can be used as a detector coil.

As described above, the circuit added to the coil assembly according to the present invention can act to remove degeneracy of the coil and serve as a double (or more) tuning circuit. The configuration of this circuit can be modified variously. Furthermore, various kinds of coils can be combined by forming a hole inside the coil assembly, in the outer surface of the coil assembly, or in the cavity body of the coil assembly. In addition, the coil assembly can be cooled. This lowers the electrical resistance of the conductors, resulting in a higher Q factor. As a consequence, the sensitivity can be enhanced further.

Figure 11B:
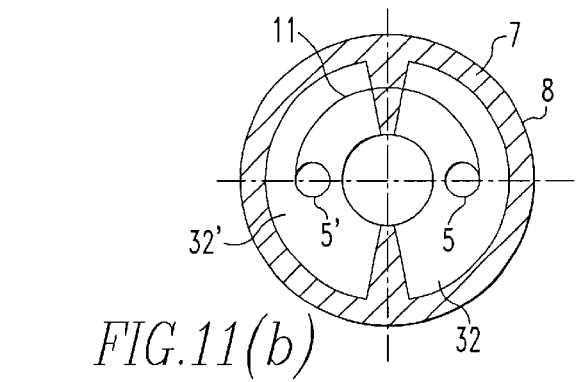
FIGS. 11(a)–11(d) are views illustrating an example in which a coil assembly is made up of conductors and electrodes.
Figure 11A:
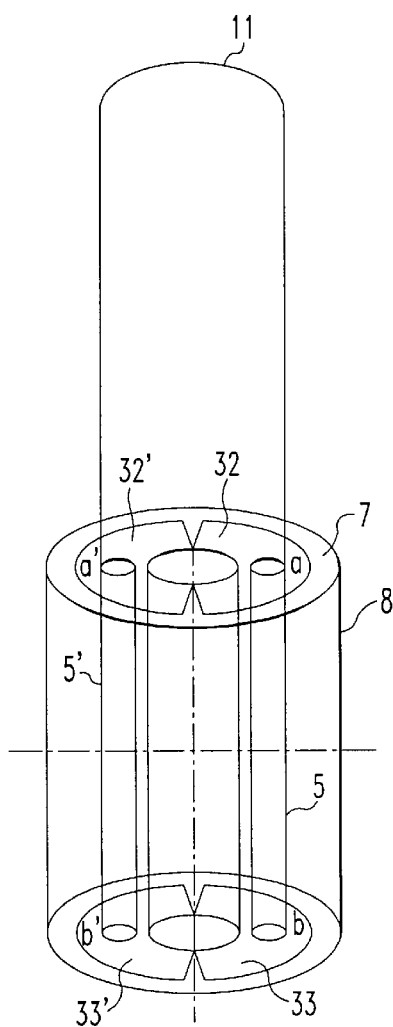
Figure 11C:
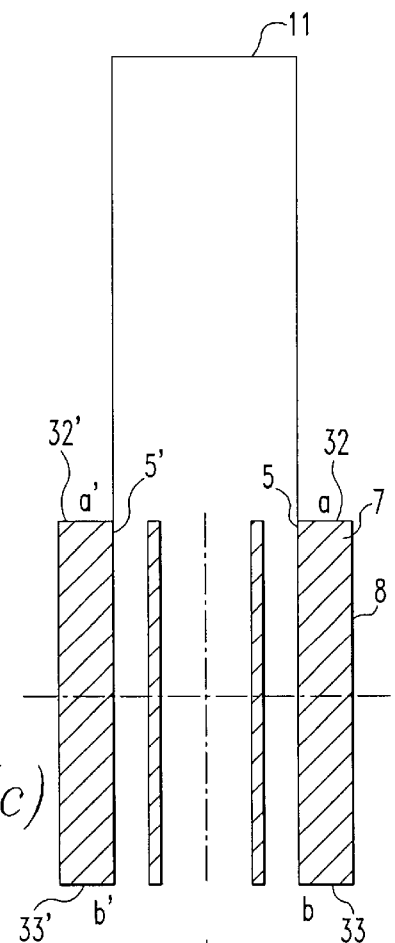
Figure 11D:
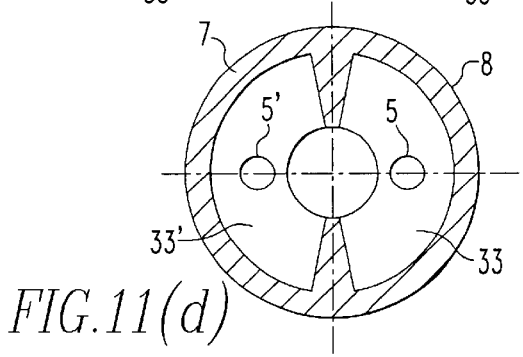

FIGS. 11(a)–11(d) show an example in which a coil assembly is composed of conductors and electrodes. FIG. 11(a) is a perspective view. FIG. 11(b) is a top view. FIG. 11(c) is a vertical cross section. FIG. 11(d) is a bottom view. The coil assembly has conductors 5 and 5'. Electrodes 32 and 32' stuck on a cavity body 7 are connected with the upper ends of the conductors 5 and 5'. The lower ends of the conductors 5 and 5' are similarly connected with electrodes 33 and 33'. When the electrodes 32 and 32' are interconnected by a conducting line 11, the coil assembly operates similarly to the coil assembly of FIG. 9 in the same way as already described in connection with FIGS. 10(a) and 10(b).

Figure 12B:
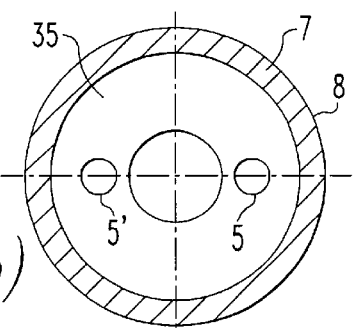
FIGS. 12(a)–12(d) are views illustrating an example in which conductors of a coil assembly are shorted together at their upper ends.
Figure 12A:
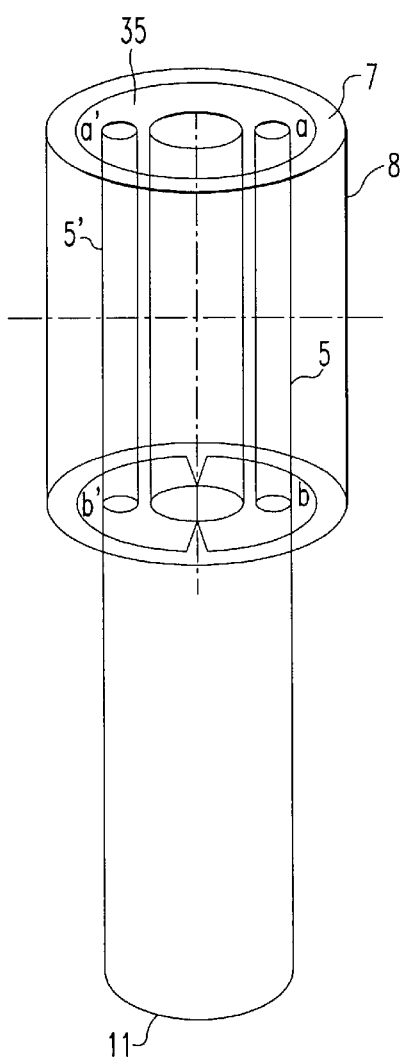
Figure 12C:
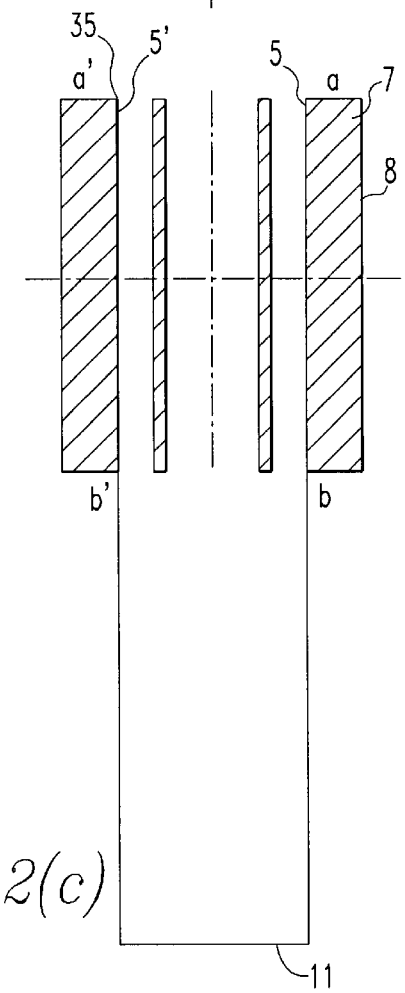
Figure 12D:
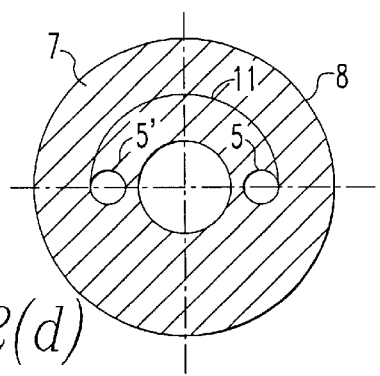

FIGS. 12(a)–12(d) show an example in which conductors of a coil assembly are shorted together at their top ends. FIG. 12(a) is a perspective view. FIG. 12(b) is a top view. FIG. 12(c) is a vertical cross section. FIG. 12(d) is a bottom view. The coil assembly has conductors 5 and 5'. These conductors 5 and 5' are shorted together at their top ends by a conductive plate 35 stuck on a cavity body 7. This coil assembly operates similarly to the coil assembly described already in connection with FIGS. 10(a) and 10(b). The conductive plate 35 may be connected with a shield 8.

Figure 13:
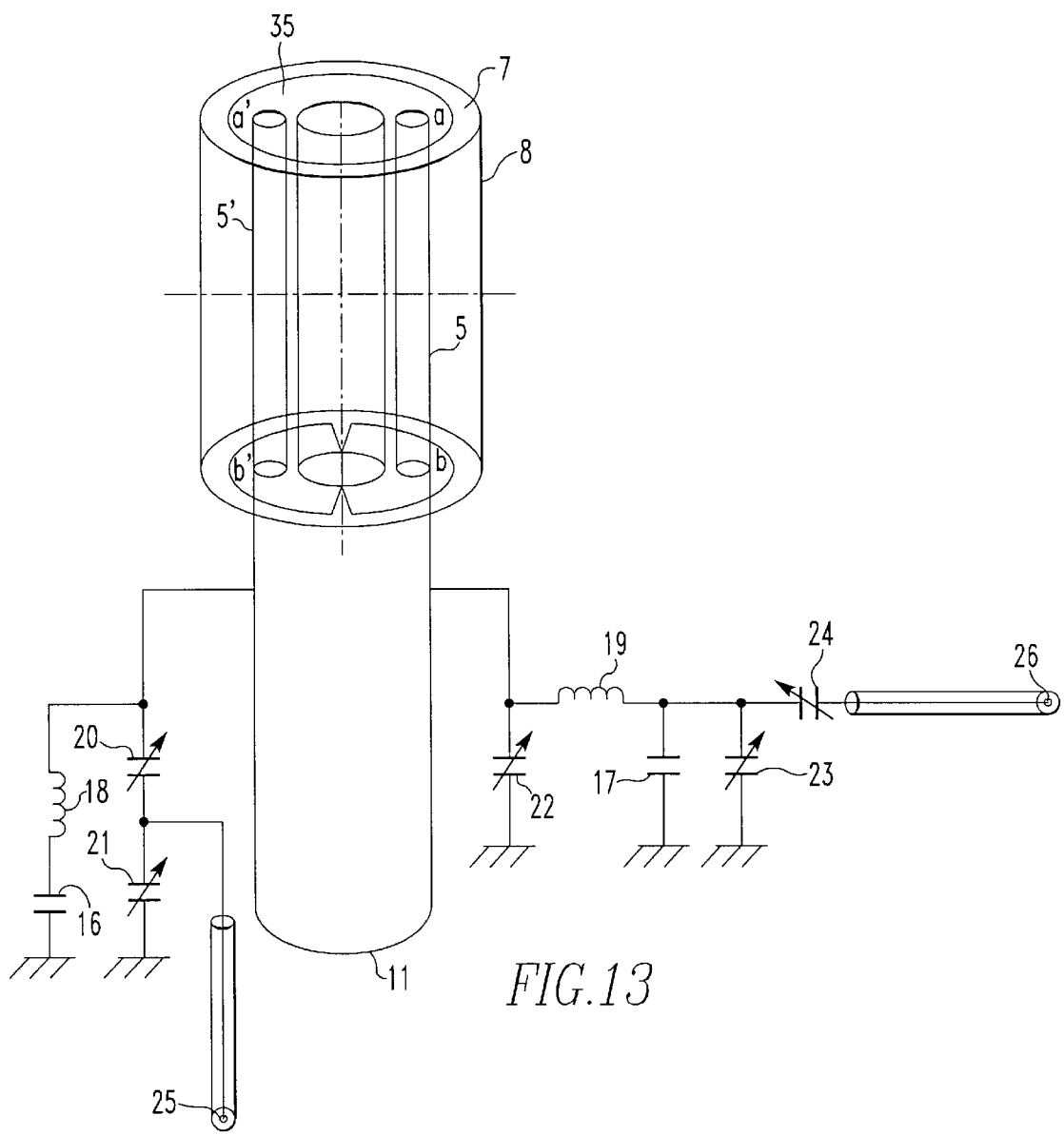
FIG. 13 is a diagram similar to the diagrams of 12(a)–12(d), but in which a double tuning circuit is added.

Referring to FIGS. 12(a)–12(d), a double tuning circuit similar to the circuit shown in FIG. 8 can be added to the underside of the conductors 5 and 5' of the coil assembly as shown in FIG. 13 to do a double tuning. The operation for double tuning is exactly the same as in the case of FIG. 8 and so its description is omitted. Of course, a triple (or more) tuning circuit may also be employed.

Figure 14A:
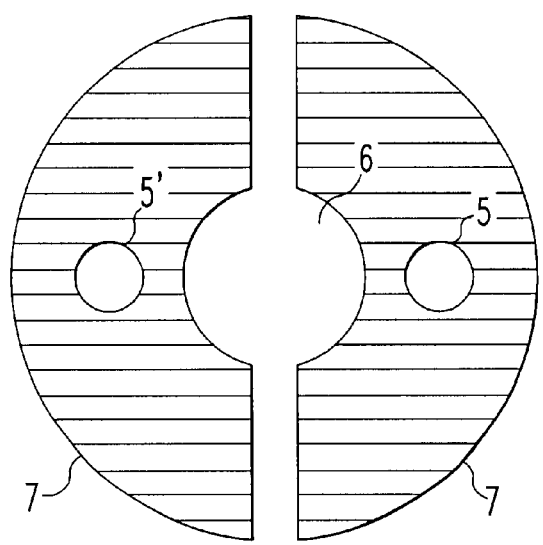
FIGS. 14(a)–14(b) are views illustrating examples of a cavity body.
Figure 14B:
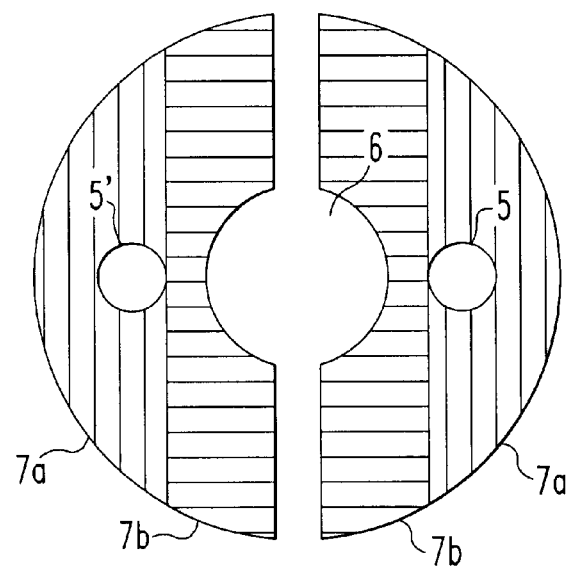
Figure 15:
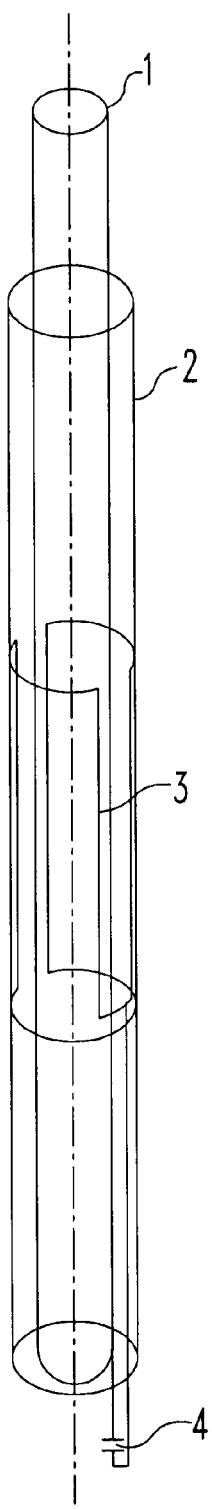
FIG. 15 is a view illustrating a conventional NMR detector coil.

It is to be understood that the present invention is not limited to the various embodiments described above. For example, the function of the external electric circuit which includes conducting lines 11, 14, 15 and is added to the detector coil to avoid degeneracy can be imparted to a double (or more) tuning circuit. For example, the conducting lines 14, 15, and the capacitor 13 of FIG. 8, and the conducting line 11 of FIGS. 11 and 13 may be omitted. For example, in forming the coil assembly, two or more pairs of conductors may be used instead of one pair. For example, the outward shape of the cavity body may be made as not only a cylinder but also a polygonal pillar. For example, in forming a cavity body 7, it may be composed of two or more parts of component being made of the same dielectric material as shown in FIG. 14(a). Additionally, the said components may consist of different kinds of dielectric materials (7a, 7b) as shown in FIG. 14(b).

As described thus far, in the present invention, the impedance of a coil is lowered by a cavity body made of a dielectric material. This weakens the strength of the RF electric field applied to the sample. Therefore, the dielectric loss due to the sample is alleviated. This suppresses drop of the Q factor. Hence, decrease in the sensitivity due to the sample can be suppressed. Furthermore, the cavity body made of a dielectric material shortens the wavelength of electromagnetic waves. The width of the current path in the coil remains the same but the length is reduced. Therefore, the energy loss due to the electrical resistance decreases. Consequently, the Q factor can be improved. In addition, the added circuit eliminates unwanted degenerate resonance modes and so the coil assembly can be operated as a detector coil using the cavity body made of a dielectric material.

Having thus described my invention with the detail and particularity required by the Patent Laws, what is desired protected by Letters Patent is set forth in the following claims.

The invention claimed is:

1. A resonance signal transmitter detector for irradiating a sample with an RF magnetic field and detecting a resonance signal emanating from the sample comprising:

a cavity body made of a dielectric material, said cavity body having an axis;

a sample insertion port having an axis parallel to the axis of said cavity body;

a single pair of conductors used for detection of a resonance signal, said conductors extending substantially parallel to said sample insertion port, said conductors being arranged substantially symmetrically with respect to the axis of said sample insertion port and extending end-to-end thereof, said conductors being placed in one of said cavity body and said sample insertion port; and an external electric circuit means between the ends of the conductors at one axial end of the cavity body such that a standing wave may be established in said conductors and for avoiding degeneracy of resonance modes.

2. The resonance signal detector of claim 1, wherein said external electric circuit is made up of electric parts and a transmission line, said electric parts including a conducting line, coils, and capacitors.

3. The resonance signal detector of claim 1, wherein the resonance signal can be detected at two or more kinds of frequencies.

4. A resonance signal detector assembly comprising plural resonance signal detectors including at least one resonance signal detector set forth in any one of claims 2 and 3.

5. A resonance signal detector comprising:

a cavity body made of a dielectric material, said cavity body having an axis;

a sample insertion port having an axis parallel to the axis of said cavity body; and a single pair of conductors used for detection of a resonance signal, said conductors extending substantially parallel to said sample insertion port, said conductors being arranged substantially symmetrically with respect to the axis of said sample insertion port and extending end-to-end thereof, said conductors being placed in one of said cavity body and said sample insertion port, wherein said conductors at one axial end of the cavity body being electrically shorted together in terms of high frequencies by a given length of conducting material extending outside of said cavity body such that a standing wave may be established in the shorted conductors.

6. The resonance signal detector of claim 5, wherein said given length of conducting material is so set as to be capable of resonating at a resonance frequency of said resonator signal detector.

7. The resonance signal detector of claim 5 or 6, wherein said given length of conducting material has at least coils or capacitors in its intermediate parts.

8. The resonance signal detector of claim 5 or 6, wherein the resonance signal can be detected at two or more kinds of frequencies.

9. The resonance signal detector of claim 5 or 6, wherein electrodes connected with said conductors used for detection of the resonance signal are mounted on at least one of top and bottom surfaces of said cavity body.

* * * * *